United States Patent
Iijima et al.

(10) Patent No.: US 8,324,760 B2
(45) Date of Patent: Dec. 4, 2012

(54) SEMICONDUCTOR DEVICE AND RADIO COMMUNICATION DEVICE

(75) Inventors: Masanori Iijima, Kanagawa (JP);
Yoshiaki Harasawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 281 days.

(21) Appl. No.: 12/835,280

(22) Filed: Jul. 13, 2010

(65) Prior Publication Data

US 2011/0074220 A1    Mar. 31, 2011

(30) Foreign Application Priority Data

Sep. 28, 2009    (JP) .................................. 2009-221935

(51) Int. Cl.
*H02M 3/06*    (2006.01)
(52) U.S. Cl. ......................... 307/109; 327/530; 455/333

(58) Field of Classification Search .................. 307/108, 307/109, 139, 140, 149, 151; 327/530; 455/333, 455/550.1
See application file for complete search history.

(56) References Cited

U.S. PATENT DOCUMENTS

| | | | |
|---|---|---|---|
| 6,642,774 B1 * | 11/2003 | Li | 327/536 |
| 6,804,502 B2 | 10/2004 | Burgener et al. | |
| 2009/0200874 A1 * | 8/2009 | Takai et al. | 307/109 |

* cited by examiner

*Primary Examiner* — Carlos Amaya
(74) *Attorney, Agent, or Firm* — Mattingly & Malur, PC

(57) ABSTRACT

To provide a fast charge means for a capacitor in a negative bias generation circuit. A capacitor is present in a down converter in a negative bias generation circuit. In order to perform fast charge, the capacitance of the capacitor is reduced and a necessary amount of charge is minimized. On the other hand, an external capacitance provided separately from the capacitor in the down converter is coupled directly to a power supply voltage and charged. After the capacitor in the down converter is charged, the external capacitance and the capacitor in the down converter are coupled in parallel. Due to this, it is made possible to aim at both the increase in charge speed and the improvement of resistance to ripple noise.

10 Claims, 17 Drawing Sheets

SEMICONDUCTOR DEVICE AND RADIO COMMUNICATION DEVICE

CROSS-REFERENCE TO RELATED APPLICATION

The disclosure of Japanese Patent Application No. 2009-221935 filed on Sep. 28, 2009 including the specification, drawings and abstract is incorporated herein by reference in its entirety.

BACKGROUND OF THE INVENTION

The present invention relates to providing an input/output selection switch of a radio communication device and in particular, a fast charge means for a capacitor in a negative bias generation circuit.

A radio transceiver is generally used widely. For a mobile telephone etc., the UMTS (W-CDMA) system using CDMA (Code Division Multiple Access) is the mainstream of the multiple access system, however, a radio transceiver that uses TDMA (Time Division Multiple Access) is still used widely.

In a radio transceiver that employs the TDMA system, it is common to use one antenna by switching between transmission and reception. FIG. 1 is a conceptual diagram of an antenna switch circuit 1000 that switches between the transmission side and the reception side of the antenna.

The antenna switch circuit 1000 has two terminals, that is, a transmission input terminal and a reception output terminal. The antenna switch circuit is a circuit for the purpose of electrically coupling the transmission input terminal and the antenna for transmission and the reception output terminal and the antenna for reception, respectively.

The antenna switch circuit 1000 includes antenna switch transistors MN1, MN2, MN3 and MN4. As the antenna switch transistors MN1, MN2, MN3 and MN4, conventionally, a pHEMT (gallium arsenide) FET is used generally.

The antenna switch transistors MN1 and MN4 operate as a switch for grounding and the antenna switch transistors MN2 and MN3 operate as a switch for antenna connection, respectively. Consequently, when the transmission input terminal is connected to the antenna, the antenna switch transistor MN2 turns ON and on the other hand, the antenna switch transistor MN1 turns OFF. This is the same for transmission, and thus, the operation of the antenna switch transistor MN1 is always opposite to that of the antenna switch transistor MN2. This is the same for the antenna switch transistor MN3 and the antenna switch transistor MN4.

The source and drain of each of these antenna switch transistors are coupled by a resistor having a high resistance value. Consequently, the potential of the source is the same as that of the drain and further, the antenna switch transistors MN1 and MN4 are grounded, and thus, all of the potentials of source/drain terminals of these transistors are the GND potential.

When a switching control circuit 1001 controls the potential of a gate terminal of each of these antenna switch transistors, the turning ON/OFF of these antenna switch transistors can be controlled. When a negative bias is not used, a control output of the switching control circuit 1001 is either the GND potential or the VDD potential.

In transmission, a signal having an amplitude Vpp that fluctuates positively and negatively passes through the transmission input terminal. In order for the antenna switch transistor to turn OFF, the source/drain potential needs to be greater than or equal to the potential of a gate terminal. There may be however a case where it becomes less than or equal to the gate potential at the time of the lower limit peak of a signal to be input to the transmission input terminal depending on the amplitude amount of the signal to be input to the transmission input terminal.

To the drain of the antenna switch transistor MN1, a potential of a several volts is applied usually. Consequently, unless the source/drain potential is greater than or equal to the gate potential, (A) point in the figure is short-circuited as a result. This short circuit causes the waveform at the (A) point on the negative side to be clipped at GND, resulting in a distortion of the waveform.

FIG. 2 is a circuit diagram showing a configuration of a conventional pHEMT SW.

The conventional pHEMT SW is configured to include a step-up circuit 2001 and a SW transistor 2002.

The step-up circuit 2001 steps up a control voltage and gives a higher potential to the gate voltage than to the voltage between the source and drain of the SW transistor 2002. Due to this, the same effect as that of the negative bias is obtained. Software is designed to be capable of operating at high speed so that its start-up time may respond to the charge time of the step-up circuit.

For such a problem that the waveform is clipped at GND, U.S. Pat. No. 6,804,502 (Patent Document 1) discloses a technique to prevent the waveform from being clipped at GND by causing the control circuit to generate a negative bias.

SUMMARY OF THE INVENTION

In the control circuit described in Patent Document 1, a negative bias generation circuit is present. Then, it is necessary to charge the capacitor in the negative bias generation circuit, specifically, the capacitor in the step-up circuit 2001. The conventional negative bias generation circuit requires a charge time of about 100 μsec after turning on the power to charge the capacitor.

The pHEMT FET used in the antenna switch transistor has been however gradually replaced with the SOI (Silicon On Insulator)-SW recently. The SOI-SW is poor in responsivity of operation and if the software supporting the charge time on the supposition of the use of pHEMT FET is applied as it is, there is a possibility of the occurrence of erroneous operation.

This is explained in FIG. 2.

It can be seen from FIG. 2 that the step-up circuit 2001 includes two diodes. It is necessary to configure the two diodes as a high frequency diode to operate the step-up circuit 2001. In the SOI process at present, it is however difficult to manufacture a high frequency diode.

Further, when the step-up circuit is not used, a circuit is necessary, which generates a negative bias as in the invention described in Patent Document 1. The description in Patent Document 1 however does not refer to the viewpoint of increasing the speed of the fall of the negative bias.

Hence, in order to use the conventional software, faster charge is indispensable.

The present invention has been made in view of the above circumstances and provides a charge means for rapidly charging a capacitor in a negative bias generation circuit. More specifically, techniques are provided that 1) high frequency oscillation is performed only at the fall of the negative bias and 2) the charge capacity is reduced only at the fall of the negative bias.

The other purposes and the new feature of the present invention will become clear from the description of the present specification and the accompanying drawings.

The following explains briefly the outline of a typical invention among the inventions disclosed in the present application.

A semiconductor device according to a typical embodiment of the present invention is one having a negative bias generation circuit including: an oscillation circuit that can switch an output thereof between high frequency oscillation and low frequency oscillation; a down converter circuit that includes a first capacitor and stores charges in the first capacitor by an output of the oscillation circuit; a charge capacity switching circuit; and a second capacitor that is coupled in parallel to the first capacitor and can be disconnected electrically by the charge capacity switching circuit, wherein the oscillation circuit performs high frequency oscillation when the power of the semiconductor device is turned on, wherein the charge capacity switching circuit electrically disconnects the second capacitor from the first capacitor, and wherein the down converter circuit stores charges in the first capacitor.

The semiconductor device may be characterized in that when the output of the oscillation circuit changes from high frequency oscillation to low frequency oscillation, the charge capacity switching circuit electrically couples the second capacitor to the first capacitor.

The semiconductor device may be characterized in that the charge capacity switching circuit outputs a timing signal and the output of the oscillation circuit changes from high frequency oscillation to low frequency oscillation upon receipt of the timing signal.

The semiconductor device may be characterized by further including a power amplifier that supplies a power supply voltage and in that the power supply voltage supplied by the power amplifier is changed in accordance with the timing signal.

The semiconductor device may be characterized by further including a reset circuit and in that the reset circuit outputs a reset signal and the output of the oscillation circuit changes from high frequency oscillation to low frequency oscillation upon receipt of the reset signal.

The semiconductor device may be characterized by further including a power amplifier that supplies a power supply voltage and in that the power supply voltage supplied by the power amplifier is changed in accordance with the reset signal.

The semiconductor device may be characterized in that while the second capacitor is disconnected from the first capacitor, the second capacitor stores charges from the power supply voltage.

These semiconductor devices may be characterized in that the oscillation circuit is configured to include an RC oscillator or that the oscillation circuit is configured to include a ring oscillator.

A radio communication device including these semiconductor devices may be characterized in that the semiconductor device is used in an antenna switching circuit.

The following explains briefly the effect acquired by the typical invention among the inventions disclosed in the present application.

Due to the semiconductor device according to the typical embodiments of the present invention, it is made possible to store charges at high speed in a capacitor included in a negative bias generation circuit of the semiconductor device.

Ripple noise is prevented from riding on a negative bias by coupling a capacitor prepared separately from a capacitor included in a negative bias generation circuit in parallel so as to be capable of being disconnected electrically, storing charges from a power supply voltage in the capacitor prepared separately while charges are stored in the capacitance included in the negative bias generation circuit, and electrically coupling the capacitor prepared separately to the capacitance included in the negative bias generation circuit after charges are fully stored therein.

DETAILED DESCRIPTION OF THE PREFERRED EMBODIMENTS

Embodiments of the present invention will be explained below using the drawings.

First Embodiment

A first embodiment will be explained first using the drawings.

Figure 1:
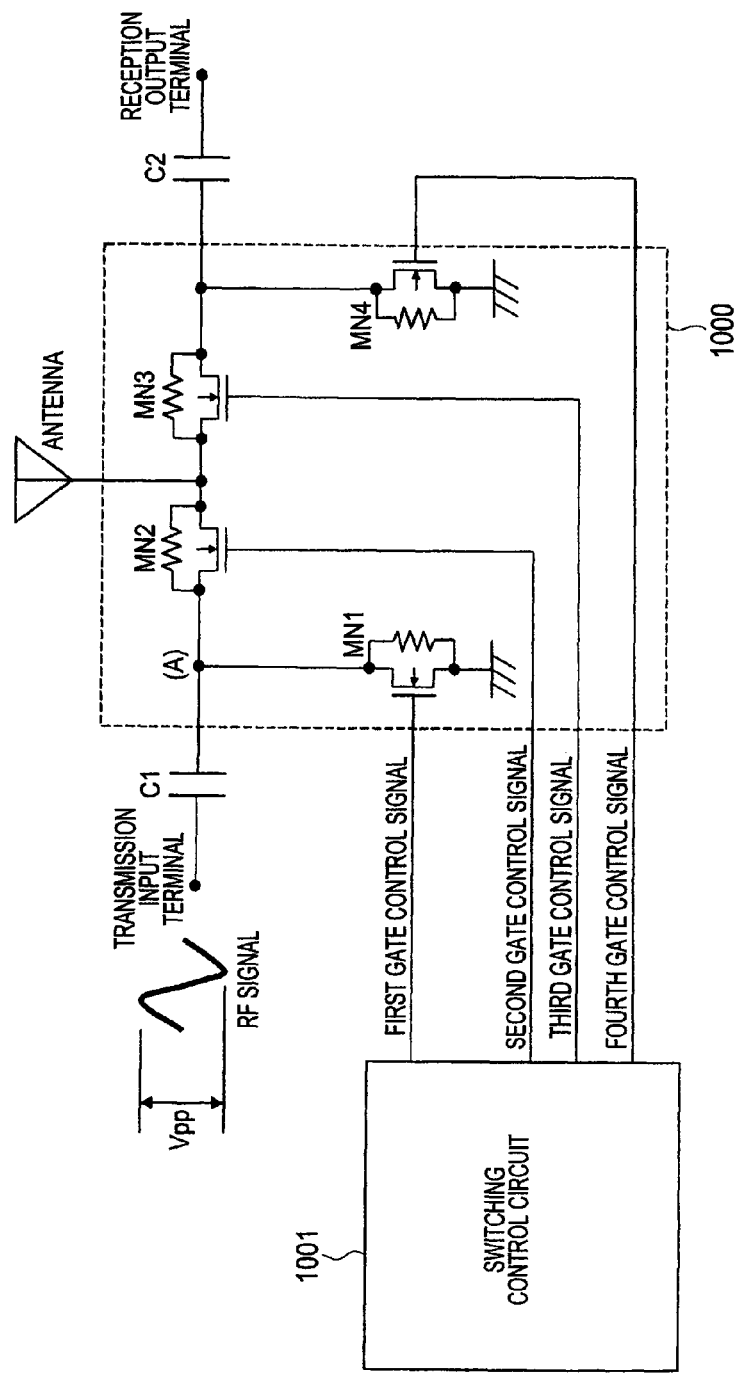
FIG. 1 is a conceptual diagram of an antenna switch circuit that switches between a transmission side and a reception side of an antenna.
Figure 2:
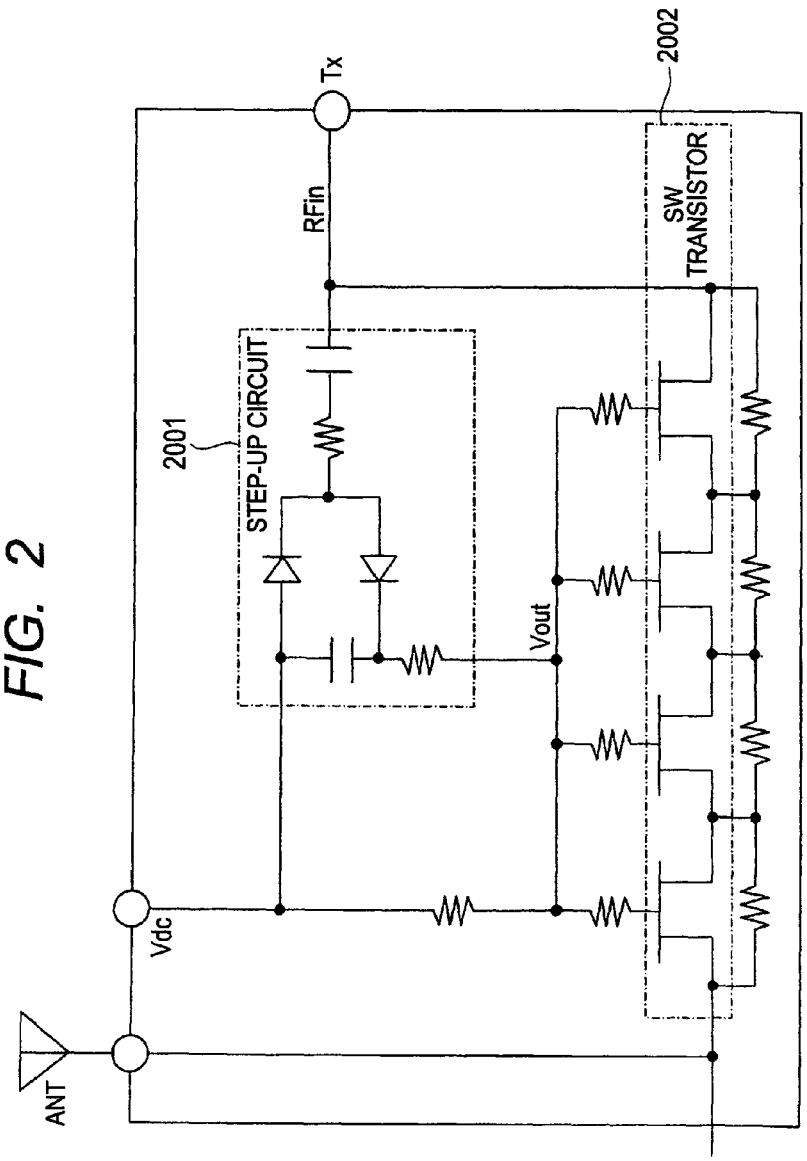
FIG. 2 is a circuit diagram showing a configuration of a conventional pHEMT SW.
Figure 3:
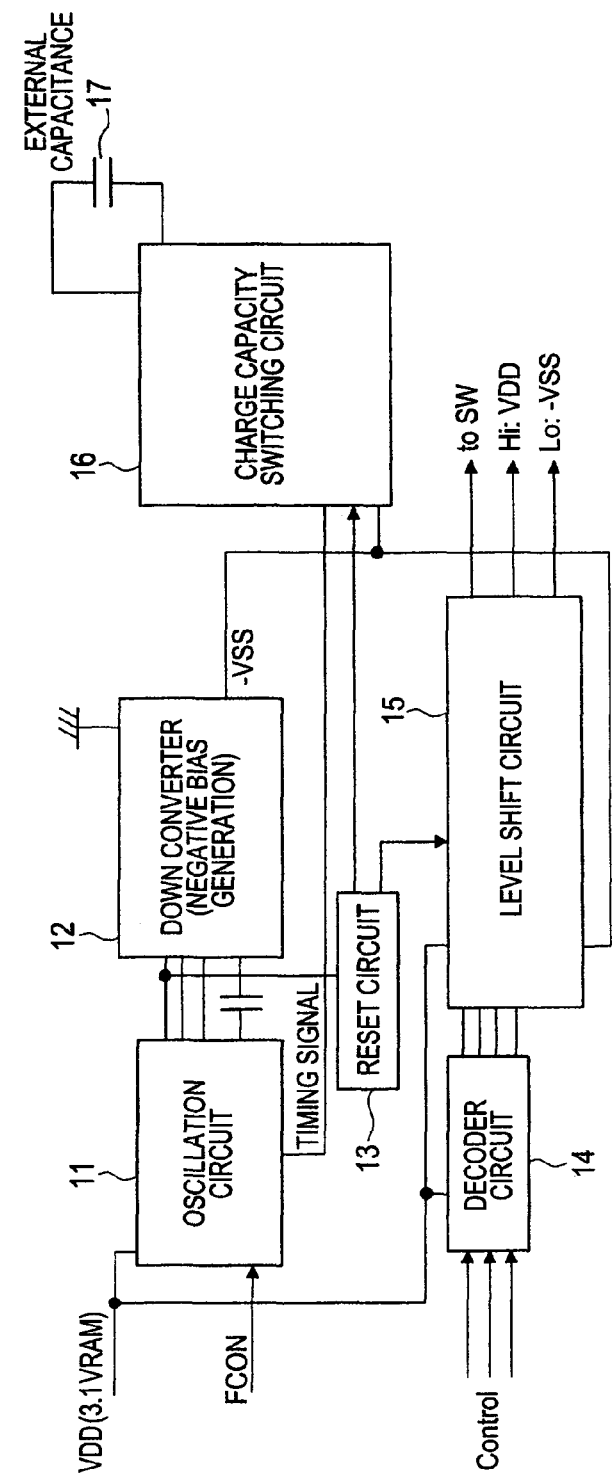
FIG. 3 is a block diagram showing a configuration of a negative bias generation circuit according to an embodiment of the present invention.

FIG. 3 is a block diagram showing a configuration of a negative bias generation circuit 1 according to an embodiment of the present invention. The negative bias generation circuit includes an oscillation circuit 11, a down converter 12, a reset circuit 13, a decoder circuit 14, a level shift circuit 15, a charge capacity switching circuit 16, and an external capacitance 17.

The oscillation circuit 11 is an oscillator that supplies an operation clock.

Figure 4:
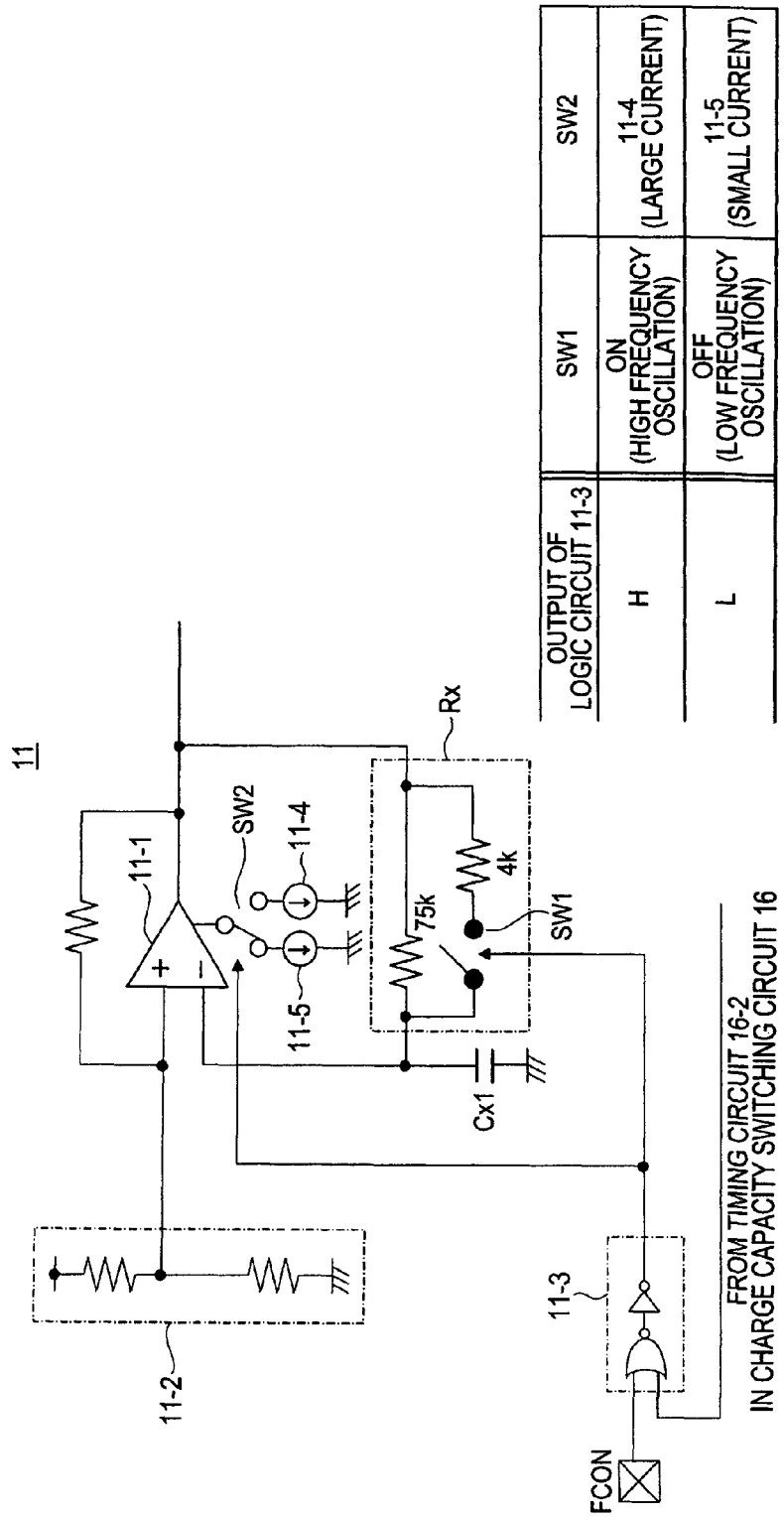
FIG. 4 is a circuit diagram showing a configuration of an oscillation circuit according to a first embodiment of the present invention and a truth table showing its operation.

FIG. 4 is a circuit diagram showing a configuration of the oscillation circuit 11 according to the first embodiment of the present invention and a truth table showing its operations.

The oscillation circuit 11 is a circuit of an RC oscillator having a so-called "Shishi-odoshi (deer-scarer)" configuration. The RC oscillator includes an operational amplifier 11-1 and its peripheral circuit, a voltage divider circuit 11-2, a logic circuit 11-3, a constant current source 11-4, a constant current source 11-5, a series RC circuit including a parallel resistor section Rx and a capacitor Cx1, a switch SW1, and a switch SW2.

In order to cause a negative bias to fall rapidly, it is desirable to perform high frequency oscillation. The current however increases at the time of high frequency oscillation. Consequently, it is necessary to reduce the oscillation frequency after the fall of negative bias in order to reduce the current consumption. After the fall of negative bias, at appropriate timing, the oscillation frequency is switched from high frequency oscillation to low frequency oscillation. At this time, the amount of current to the operational amplifier in the oscillation circuit 11 is also switched to another.

That is, a "reference voltage" is present at one of input terminals of the operational amplifier and the output of the operational amplifier is input to the other input terminal in a feedback manner. At this time, the output of the operational amplifier passes through the series RC circuit, and thereby, the voltage applied to the operational amplifier increases gradually. The voltage divider circuit 11-2 generates the "reference voltage".

In the oscillation circuit 11, two resistors of 75 KΩ and 4 KΩ are coupled in parallel. The 4 KΩ resistor of the two is configured to be electrically disconnectable by the switch SW1.

In order to increase the speed of the fall at the time of power on, high frequency oscillation is performed by switching the time constants at the time of the fall. For this purpose, switching control by the switch SW1 and switch SW2 is performed.

The switch SW1 is controlled by a switch selection signal, which is the output of the logic circuit 11-3. When the switch SW1 is open, a resistance value R of the parallel resistor section Rx is 75 KΩ and when the switch SW1 is closed, about 3.80 KΩ (ratio is about 20:1). By this switching, it is made possible to vary the time constant (time constant τ=resistance value R×electrostatic capacitance C) of the series RC circuit including the parallel resistor section Rx (resistance value R) and the capacitor Cx1 (electrostatic capacitance C).

Figure 5:
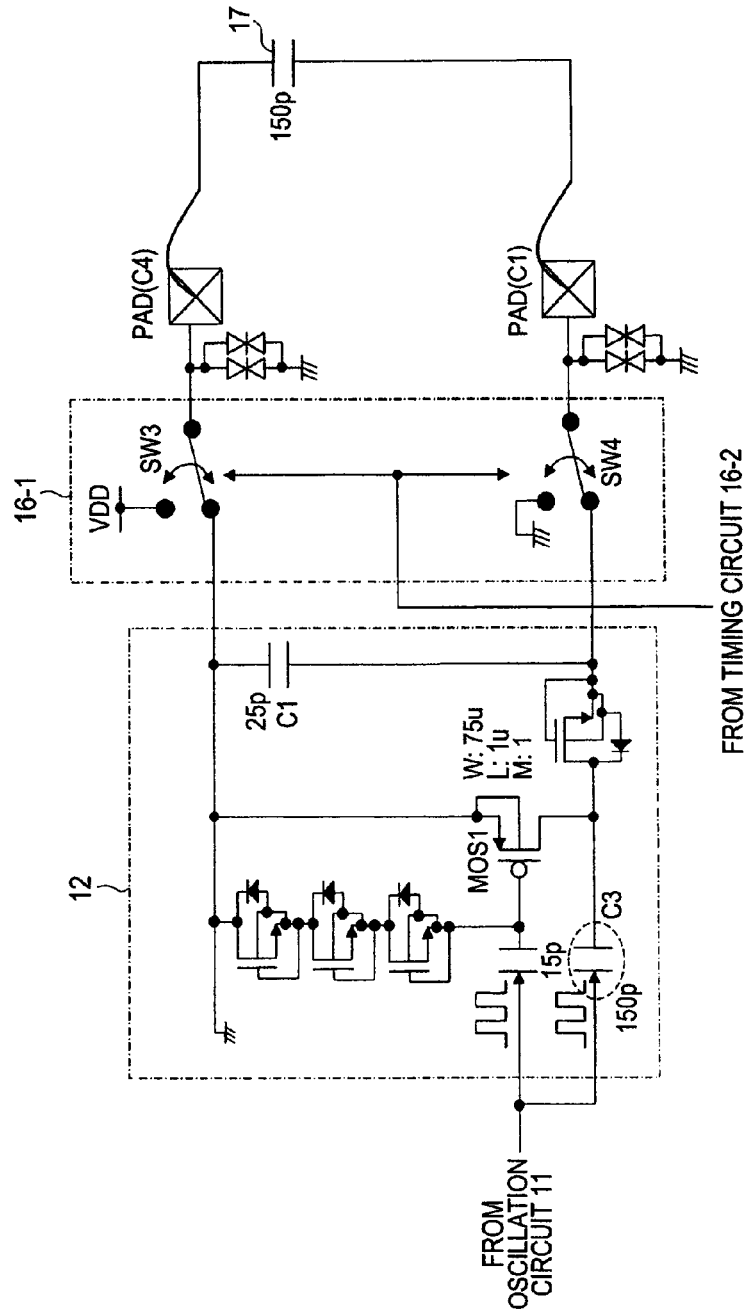
FIG. 5 is a circuit diagram showing a coupling relationship between a down converter, a switch circuit in a charge capacity switching circuit, and an external capacitance according to the first embodiment of the present invention.

The difference in the change of the time constant of the series RC circuit by the selection of the switch is not described here because of the presence of the prior art document, such as Japanese Patent Laid-Open No. 2002-358604 (FIG. 3 to FIG. 5).

The switch SW2 is also controlled by a switch selection signal, which is the output of the logic circuit 11-3. The switch SW2 is used to control the power supply current that flows through the operational amplifier 11-1. The constant current source 11-4 and the constant current source 11-5 are constant current sources having different current values prepared for this switching. In this specification, explanation is given on the assumption that the current value of the constant current source 11-4 is larger than that of the constant current source 11-5.

The constant current source 11-4 and the constant current source 11-5 are switched when high frequency oscillation or low frequency oscillation is selected. That is, when the switch SW1 is ON, the constant current source 11-4 having a higher current value is selected for high frequency oscillation. On the other hand, when the switch SW1 is OFF, the constant current source 11-5 having a lower current value is selected for low frequency oscillation.

That is, when the output of the logic circuit 11-3 (switch selection signal) is at "H", the switch SW1 is ON and the resistance value of the parallel resistor section Rx is about 3.8 KΩ. The switch SW2 is coupled to the constant current source 11-4 that causes a high current to flow.

On the other hand, when the output of the logic circuit 11-3 is at "L", the switch SW1 is OFF and the resistance value of the parallel resistor section Rx is 75 KΩ. The switch SW2 is coupled to the constant current source 11-5 that causes a low current to flow.

The correspondence among these is described in the truth table attached in FIG. 4.

The logic circuit 11-3 calculates a logical OR of a frequency control signal FCON and a timing signal output from a timing circuit 16-2 within the charge capacity switching circuit 16. The output of the logic circuit 11-3 is input to the switch SW1. The frequency control signal FCON is a signal used when fixing the output of the oscillation circuit 11 forcibly to a high frequency.

The timing signal to be input to the logic circuit 11-3 will be explained when the timing circuit 16-2, which is an output source of the signal, is explained.

The down converter 12 is a low voltage conversion circuit for generating a negative bias. An output potential −VSS of the down converter 12 forms a low potential of the output signal of the level shift circuit 15. To the down converter 12, the output of the oscillation circuit 11 is input and based on this, the down converter 12 generates a negative potential by repeating charge/discharge of each capacitor included therein.

The reset circuit 13 generates a reset signal to reset the level shift circuit 15 and the timing circuit in the charge capacity switching circuit 16 based on the operation clock output from the oscillation circuit 11.

The decoder circuit 14 controls the output of the level shift circuit, that is, output signals of the antenna switch transistors MN1 to MN4 based on the control signal from a higher-level circuit.

The level shift circuit 15 shifts the potential on the side of the lower potential of the output signals to the antenna switch transistors MN1 to MN4 to the output potential of the down converter 12 and outputs the potential.

The charge capacity switching circuit 16 includes a switch circuit 16-1 to appropriately couple the external capacitance 17 in parallel with the capacitance included in the down converter 12 and the timing circuit 16-2 that switches the switch circuit.

As described above, the external capacitance 17 is an external capacitance to increase the capacitance included in the down converter 12. The external capacitance 17 may be realized by an SMD part or as a built-in capacitor in the semiconductor device.

FIG. 5 is a circuit diagram representing a connection relationship between the down converter 12, the switch circuit 16-1 in the charge capacity switching circuit 16, and the external capacitance 17 according to the first embodiment of the present invention.

It is made possible to increase the speed of the fall of negative bias by reducing the charge capacitance. This is because smaller capacitance takes a shorter charge time.

If the capacitance is small, however, a leak current of the internal element may flow into the negative bias to discharge the charge capacitor and a ripple may be generated. If the ripple becomes large, the spurious may degrade.

Figure 6:
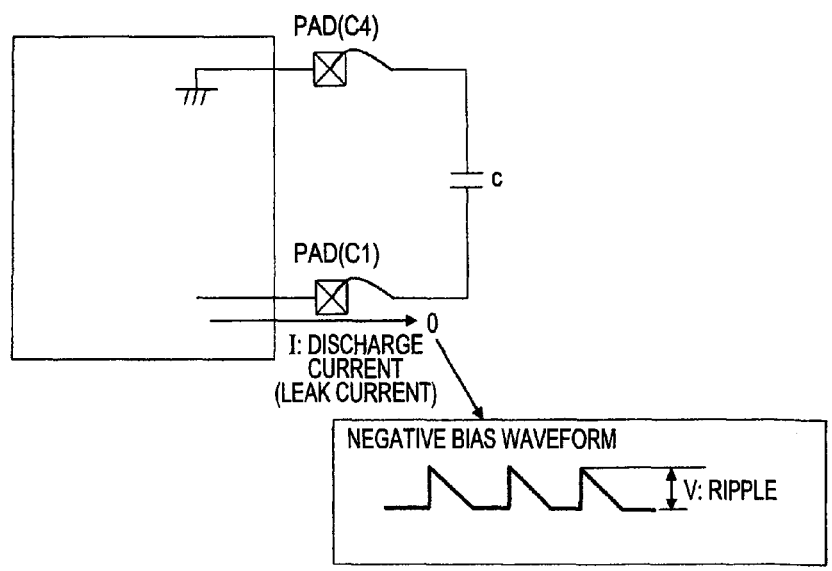
FIG. 6 is a conceptual diagram for illustrating a mechanism when a ripple occurs.

FIG. 6 is a conceptual diagram for illustrating a mechanism when a ripple occurs.

The following expression holds between a leak current I, an achieved voltage V, an electrostatic capacitance c of the external capacitance 17, and a time t.

$$V = \frac{I \times t}{c}$$ [Mathematical expression 1]

From the above expression, it can be seen that the change in voltage is larger when the capacitance is smaller. That is, a ripple becomes larger. Accordingly, it is necessary to increase the charge capacitance after the fall of negative bias in order to lengthen the hold time of charges.

Returning to FIG. 5, this mechanism is considered.

In the circuit in FIG. 5, at the time of the fall of negative bias, the charge capacity switching circuit 16 disconnects the external capacitance 17 from the down converter 12 by connecting a switch SW3 of its own to VDD and a switch SW4 to GND. Due to this operation, charges are charged in the external capacitance 17 while the external capacitance 17 is disconnected from the down converter 12.

Next, when the negative bias falls, the charge capacity switching circuit 16 switches the switch SW3 and the switch SW4 to connect the external capacitance 17 to the down converter 12.

As described above, the occurrence of a ripple is prevented by appropriately connecting the external capacitance 17 in parallel to the capacitor C1 in the down converter 12. This is the operation of the switch circuit 16-1. Then, the timing circuit 16-2 controls the switching operation.

The timing circuit 16-2 switches the two switches SW3 and SW4 included in the switch circuit 16-1 and the switches SW1 and SW2 in the oscillation circuit 11.

The signal to be input to the timing circuit 16-2 is a reset signal from the reset circuit 13 and an oscillation signal output from the oscillation circuit 11. The output of the timing circuit 16-2 is a timing signal to be output to the switch circuit 16-1 and the logic circuit 11-3.

As described above, the logic circuit 11-3 calculates a logical OR of the frequency control signal FCON and the timing signal output from the timing circuit 16-2 in the charge capacity switching circuit 16 and outputs it to the switches SW1 and SW2. Unless "H" is input to the frequency control signal FCON, the switches SW1 and SW2 in the oscillation circuit 11 and the two switches SW3 and SW4 included in the switch circuit 16-1 operate in synchronization.

The switching of the output of the timing circuit 16-2 is performed on the basis of the high frequency, which is the output of the oscillation circuit 11. The timing circuit 16-2 includes a counter circuit and controls the output so as to switch the charge capacitance and the oscillation frequency after four clocks from the start of oscillation after resetting the counter circuit. That is, it is considered that the capacitor C1 (refer to FIG. 5) included in the down converter circuit 12 is charged during the period of the four clocks of the high frequency signal.

Figure 7:
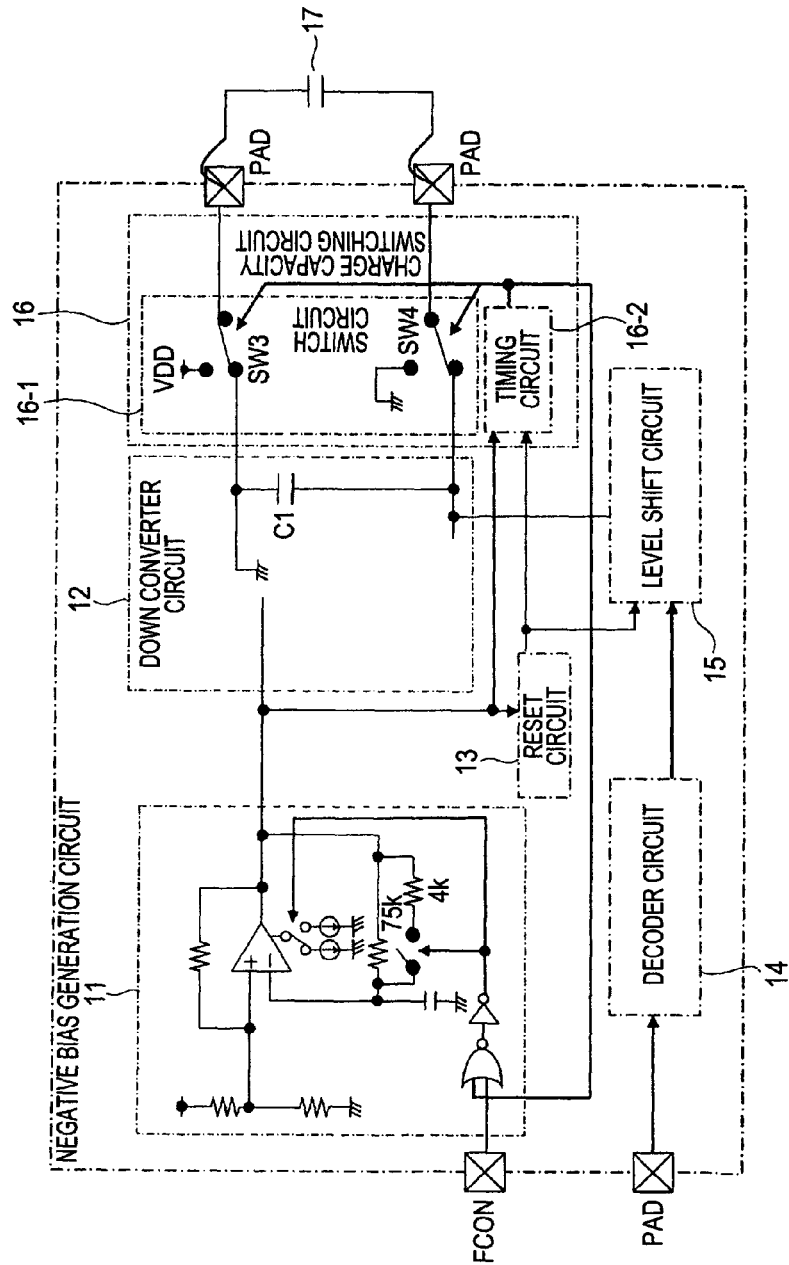
FIG. 7 is a block diagram of parts relating to a timing circuit extracted from the negative bias generation circuit according to the first embodiment of the present invention.
Figure 8:
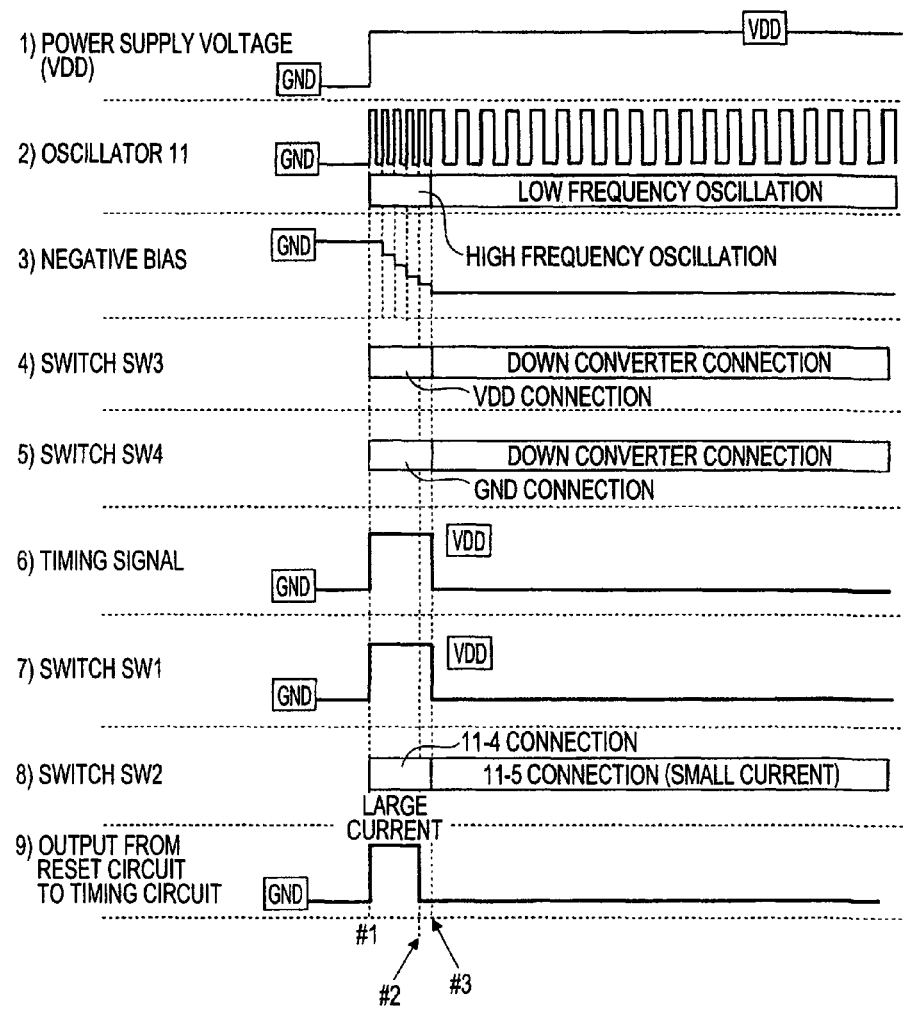
FIG. 8 is a waveform diagram for illustrating how the operation of the timing circuit and each switch affects the operation of the negative bias generation circuit.

FIG. 7 is a block diagram of the parts relating to the timing circuit 16-2 extracted from the negative bias generation circuit according to the first embodiment of the present invention. FIG. 8 is a waveform diagram for illustrating how the operation of the timing circuit 16-2 and each switch affects the operation of the negative bias generation circuit 1.

When the power supply voltage is turned on first and then a pulse of a reset signal, not shown schematically in the figure, from the reset circuit 13 is input, the timing circuit 16-2 turns the timing signal to "H" and causes the respective switches to operate as follows (FIG. 8 #1).

Switch SW1: ON, switch SW2: the constant current source 11-4 (high current value) connection, switch SW3: VDD connection, and switch SW4: GND connection. Due to this, the oscillation circuit 11 starts high frequency oscillation. The counter of the timing circuit 16-2 starts to operate using a high frequency signal output from the oscillation circuit 11 as a reference clock. The external capacitance 17 is also charged with charges directly from the power supply voltage.

By the fourth rising edge of the high frequency signal to be input to the timing circuit 16-2, the reset circuit 13 changes the reset signal from "H" to "L" (FIG. 8 #2). In response to this, the timing circuit 16-2 changes the timing signal from "H" to "L" by the rising edge of the next high frequency signal (FIG. 8 #3).

Accompanying this, the respective switches are switched as follows.

Switch SW1: OFF; switch SW2: the constant current source 11-5 (low current value) connection; switch SW3: down converter connection; and switch SW4: down converter connection. Due to the operation of the switches SW1 and SW2, the time constant of the series RC circuit (refer to FIG. 4) including the parallel resistor section Rx and the capacitor Cx1 changes and the oscillation circuit 11 is switched to low frequency oscillation. After that, the oscillation circuit 11 continues to maintain low frequency oscillation, and thereby, the power consumption can be suppressed low.

As described above, by keeping small the capacitance for generating a negative bias for a predetermined period of time after the power supply is turned on, the speed of the fall of negative bias is increased. Then, when the negative bias has fallen sufficiently, a charged capacitor is coupled in parallel to the capacitor for generating a negative bias, and thereby, a negative bias generation circuit having resistance to the occurrence of ripple can be realized.

Second Embodiment

Next, a second embodiment of the present invention will be explained using the drawings.

An object of the present embodiment is to shorten the charge time (time required for the fall of negative bias) of the capacitor C1 of the down converter 12 by varying the power supply voltage VDD to be input to the negative bias generation circuit 1.

Figure 9:
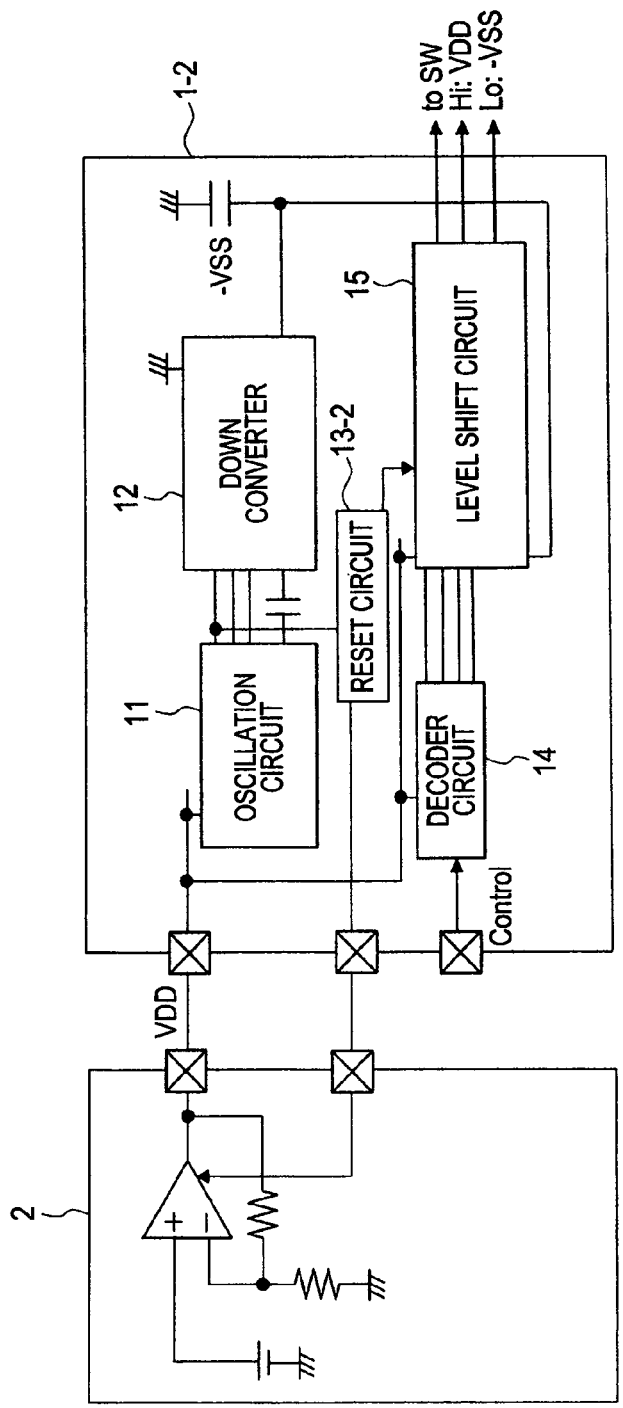
FIG. 9 is a block diagram showing a configuration of the negative bias generation circuit and a power amplifier according to the present invention.

FIG. 9 is a block diagram showing a configuration of a negative bias generation circuit 1-2 and a power amplifier 2 according to the present invention. In the present embodiment, a point of difference is that a reset signal output from a reset circuit 13-2 is also output to the power amplifier 2.

It is possible to use the same reset circuit as that in the first embodiment as the reset circuit 13-2.

The power amplifier 2 is an amplifier circuit including a regulator (constant voltage circuit). The power supply voltage VDD of the negative bias generation circuit 1 is generated by the power amplifier 2. The second embodiment of the present invention employs a configuration in which the gains of the regulator are switched by the reset signal output from the reset circuit 13-2. Due to this, it is made possible to vary the power supply voltage VDD to be input to the negative bias generation circuit 1-2.

That is, the timing signal is used as a trigger for the power amplifier 2 to output the power supply voltage VDD to the negative bias generation circuit 1-2. This is shown in FIG. 10.

Figure 10:
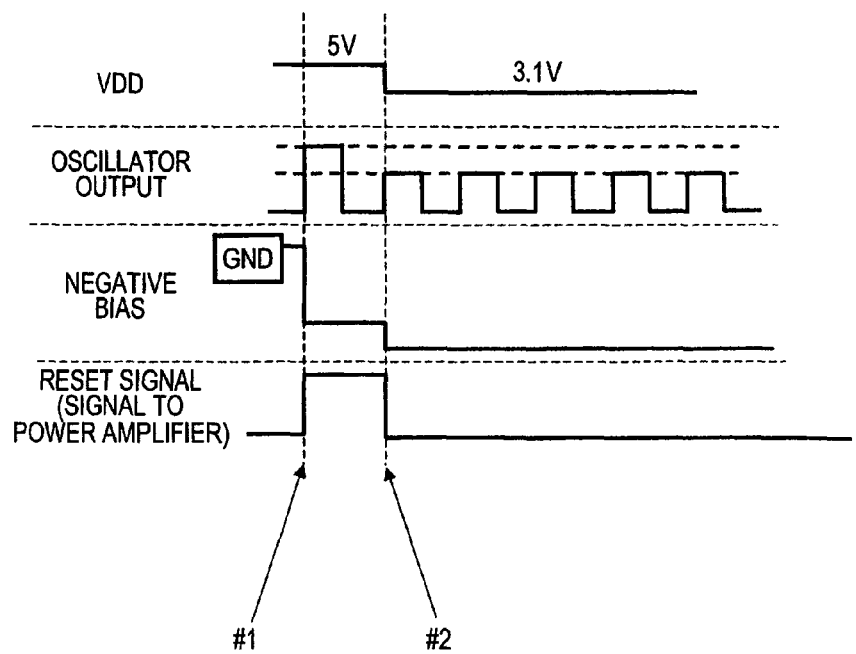
FIG. 10 is a waveform diagram showing the change in a reset signal, a negative bias, an oscillator output, and a power supply voltage of a negative bias generation circuit according to a second embodiment of the present invention.

FIG. 10 is a waveform diagram showing the change in the reset signal of the negative bias generation circuit 1-2, the negative bias, the oscillator output, and the power supply voltage according to the second embodiment of the present invention.

Immediately after the startup, when the timing signal turns to "H" (FIG. 8 #1), the timing signal is output also to the power amplifier 2 in the present embodiment (FIG. 10 #1). This triggers the power amplifier 2 to output the power supply voltage of 5 V to the negative bias generation circuit 1-2. As a result, the output level of the oscillation circuit 11 increases and the speed to charge the capacitor C1 in the down converter 12 can be increased.

On the other hand, when counting to a predetermined count, the reset circuit 13-2 changes the reset signal from "H" to "L" (FIG. 8 #2). Accompanying this, the power amplifier 2 changes the power supply voltage VDD to 3.1 V.

As described above, when high frequency oscillation is performed, the output level of the oscillation circuit 11 is increased. Due to this, the speed-up of the fall of negative bias is realized.

In the above-mentioned explanation, the power amplifier 2 is switched using the reset signal. It is however also possible to switch the power amplifier 2 using the timing signal as in the first embodiment.

Third Embodiment

Next, a third embodiment of the present invention will be explained using the drawings.

Figure 11:
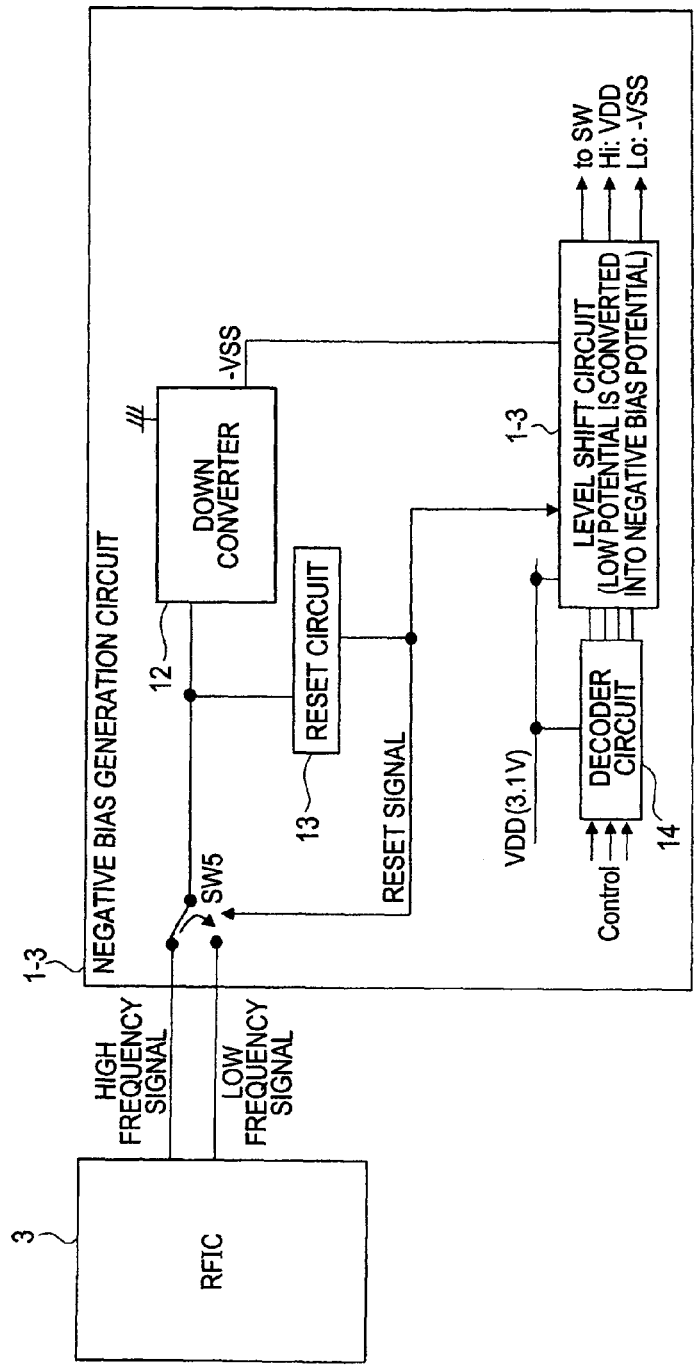
FIG. 11 is a block diagram showing a configuration of a negative bias generation circuit according to a third embodiment of the present invention.
Figure 12:
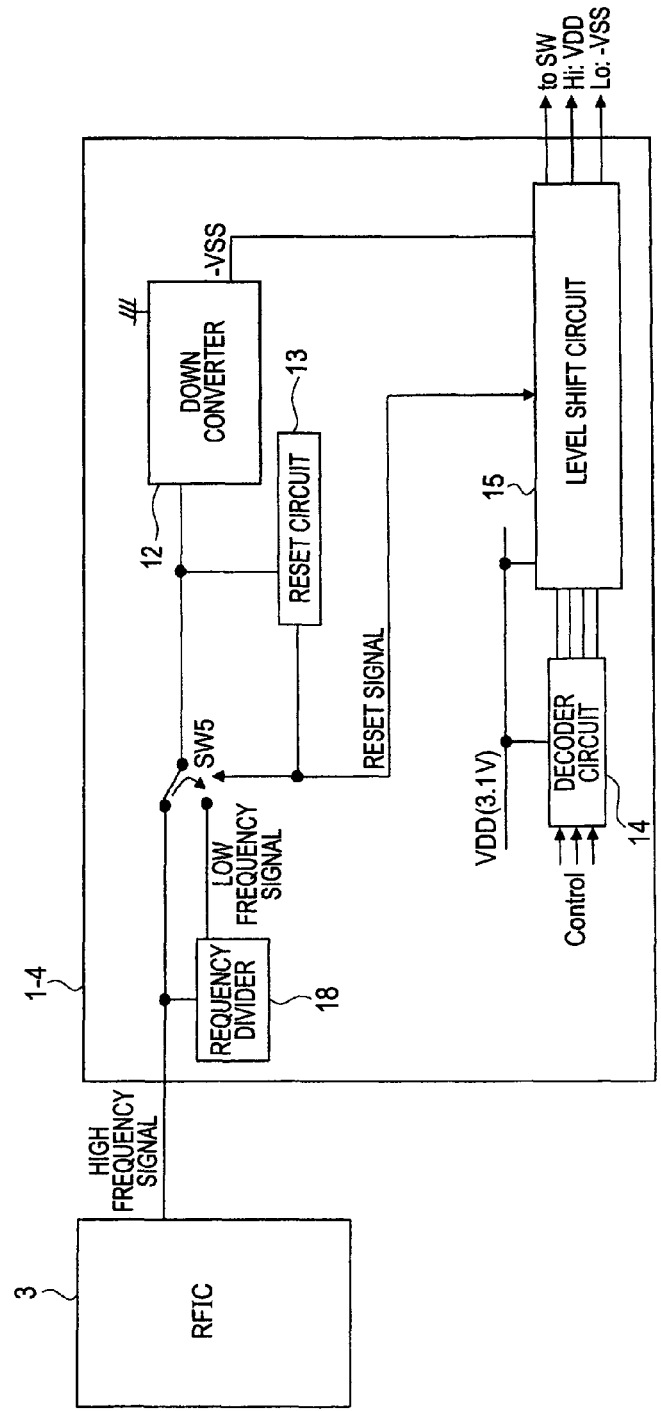
FIG. 12 is a block diagram showing a configuration of another negative bias generation circuit according to the third embodiment of the present invention.

FIG. 11 is a block diagram showing a configuration of a negative bias generation circuit 1-3 according to the third embodiment of the present invention. FIG. 12 is a block diagram showing a configuration of another negative bias generation circuit 1-4 according to the third embodiment of the present invention.

In the configuration in FIG. 11 and FIG. 12 according to the present embodiment, the oscillation circuit is not provided in the negative bias generation circuits 1-3 and 1-4. An external signal originating from an RFIC 3 etc. is used instead of the "high frequency oscillation" in the first embodiment. That is, the signal of the RFIC 3 is a high frequency signal, and thus, it is made possible to cause the negative bias to fall at high speed. Further, the oscillation circuit is not necessary in the negative bias circuit, and thus, it is also possible to reduce the current consumption.

The negative bias generation circuit in FIG. 11 differs from that in FIG. 12 in the generating method of a low frequency signal.

FIG. 11 shows an example of receiving a high frequency signal and a low frequency signal from outside. That is, it shows an example in which a switch SW5 that switches input signals is provided instead of the switches SW1 and SW2 in the first embodiment.

The switch SW5 operates upon receipt of the reset signal output from the reset circuit 13 as in the second embodiment.

On the other hand, in FIG. 12, only a high frequency signal is received from outside. The configuration is such that a low frequency signal is generated when a frequency divider 18 provided in the negative bias generation circuit 1-4 divides a high frequency signal and this is switched by the switch SW5. By operating the frequency divider 18 only when a low frequency signal is necessary, it is made possible to further reduce the power of the negative bias circuit.

As described above, it is also possible to apply the present invention by providing a high frequency oscillation source outside.

Fourth Embodiment

Next, a fourth embodiment of the present invention will be explained using the drawings.

Figure 13:
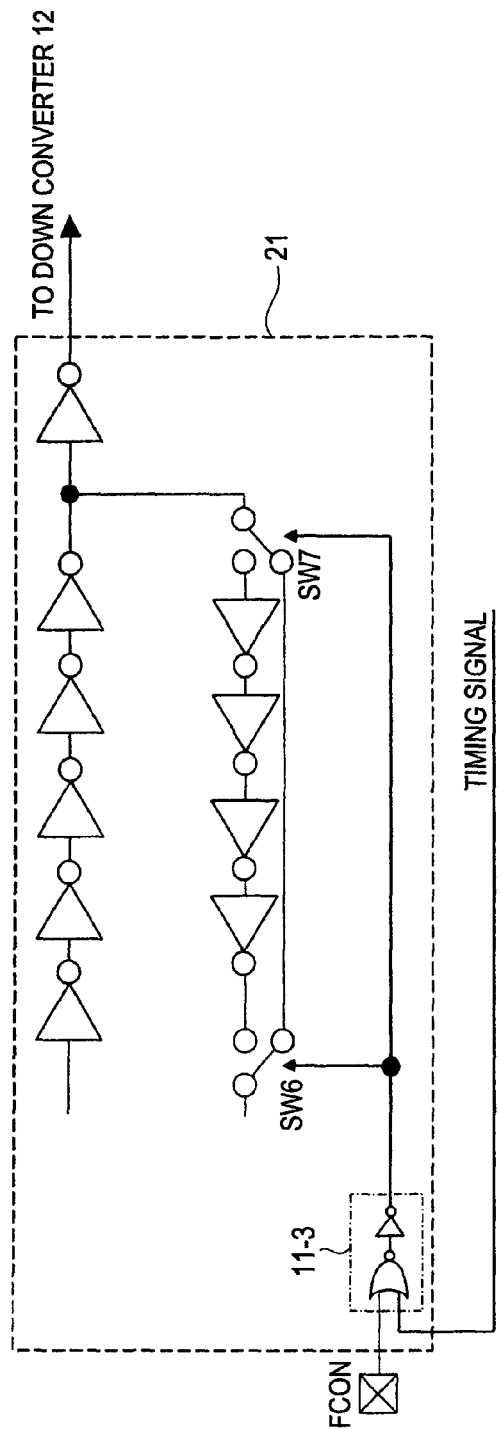
FIG. 13 is a circuit diagram showing a configuration of an oscillation circuit according to a fourth embodiment of the present invention.

FIG. 13 is a circuit diagram showing a configuration of an oscillation circuit 21 according to the fourth embodiment of the present invention.

In the first embodiment, an RC oscillator is used as the oscillation circuit 11. In contrast to this, a point of difference is that a ring oscillator is used as the oscillation circuit 21.

A ring oscillator is an oscillation circuit that oscillates by cascade-connecting an odd number of inverters. It is possible to change the frequency by changing the number of cascade-connected inverters.

The oscillation circuit 21 in FIG. 13 has switches SW6 and SW7. The switches SW6 and SW7 turn on when the output of the logic circuit 11-3 is at "H" and turn off when at "L". Then, when the switches SW6 and SW7 are turned on, the five inverters are cascade-connected and when turned off, the nine inverters are cascade-connected. The purpose of increasing and reducing the number of connected inverters is that when the number of cascade-connected inverters increases, the amount of delay increases and the frequency of oscillation decreases.

Consequently, like the oscillation circuit 11, the oscillation circuit 21 performs high frequency oscillation when the output of the logic circuit 11-3 is at "H" and low frequency oscillation when the output of the logic circuit 11-3 is at "L".

As a result of the above, it is possible to obtain the same effect as that when the RC oscillator in the first embodiment is used.

Fifth Embodiment

Next, a fifth embodiment of the present invention will be explained using the drawings.

In the first embodiment, the same signal (timing signal) is transmitted to the switches SW3 and SW4 and the logic circuit 11-3 (via which, to the switches SW1 and SW2).

If the switches SW1 and SW4 are turned on simultaneously to switch the charge capacitors, however, a potential from VDD to −VSS may be applied.

Further, when the switches SW2 and SW3 are turned on simultaneously, both the ends of the charge capacitor short-circuit to the GND and the charged charges are discharged.

The present embodiment addresses this problem.

Figure 14:
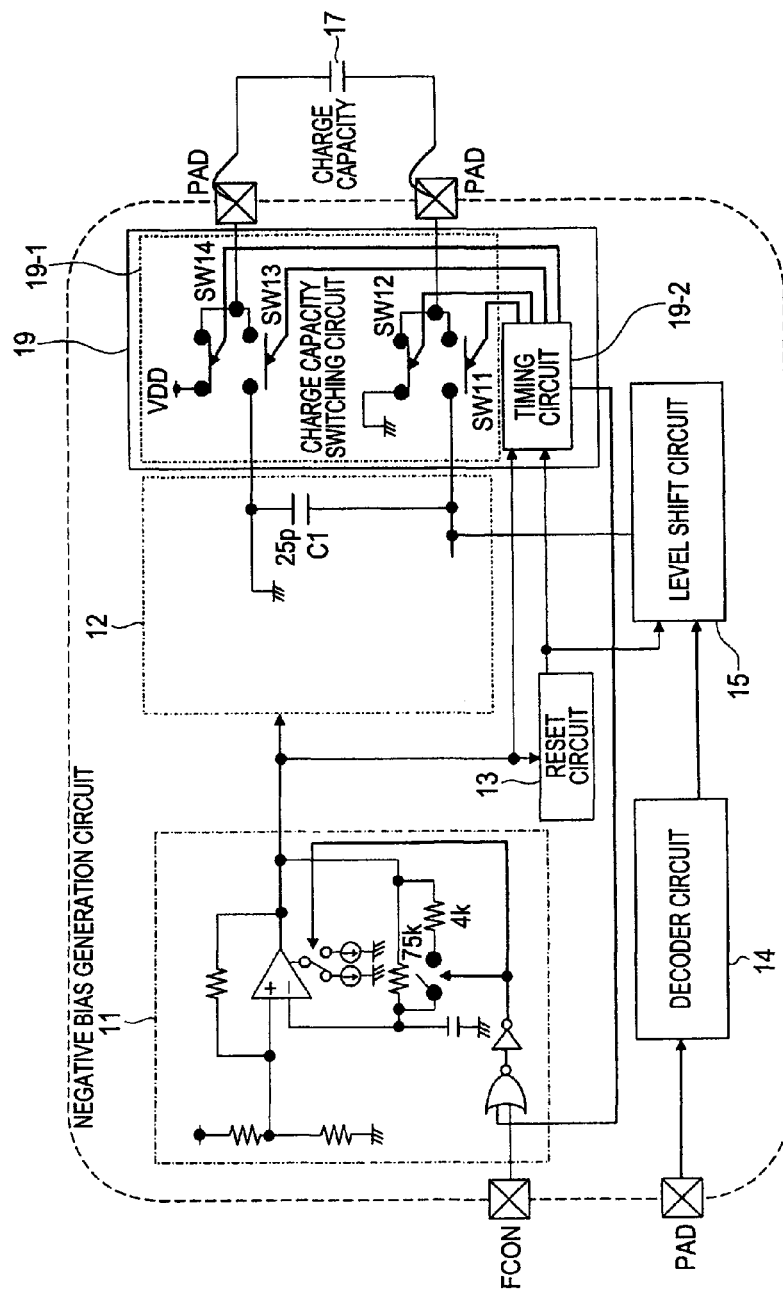
FIG. 14 is a block diagram of parts relating to a timing circuit extracted from a negative bias generation circuit according to a fifth embodiment of the present invention.

FIG. 14 is a block diagram of the parts relating to the timing circuit extracted from the negative bias generation circuit according to the fifth embodiment of the present invention.

The negative bias circuit in this figure is characterized in that a charge capacity switching circuit 19 is used instead of the charge capacity switching circuit 16.

The charge capacity switching circuit 19 is configured to include a switch circuit 19-1 and a timing circuit 19-2.

The switch circuit 19-1 includes switches SW11, SW12, SW13 and SW14.

The switch SW11 and the switch SW12 function as the switch SW3 of the switch circuit 16-1. The switch SW13 and the switch 14 function as the switch SW3.

In the first embodiment, the same signal is input to these switches, however, in the present embodiment, signals having different timings are input. These different timings are output from the timing circuit 19-2.

Unlike the timing circuit 16-2, the timing circuit 19-2 outputs five signals having different waveforms. Among these, the timing signals to be output to the logic circuit 11-3 have the same waveform.

Figure 15:
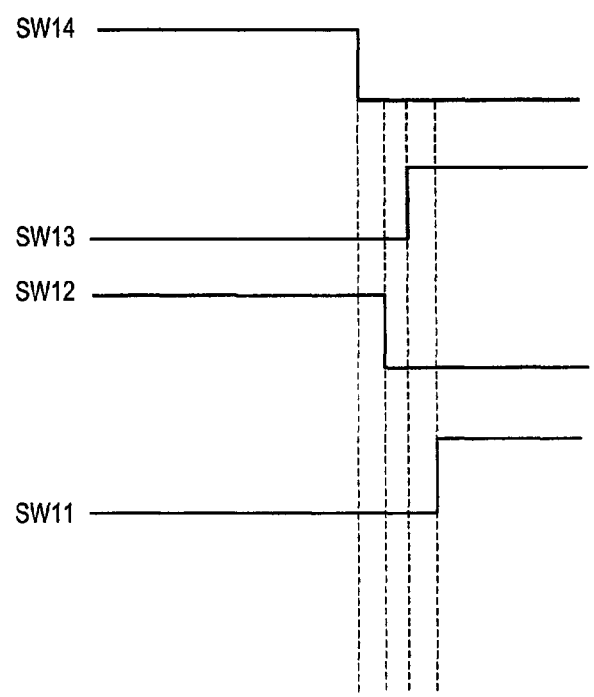
FIG. 15 is a waveform diagram showing a signal output from the timing circuit according to the fifth embodiment of the present invention to a switch circuit.

On the other hand, what corresponds to the switch circuit 19-1 differs from that in the first embodiment. FIG. 15 shows signals to be input to these switches.

FIG. 15 is a waveform diagram showing signals output from the timing circuit 19-2 to the switch circuit 19-1 according to the fifth embodiment of the present invention. As described above, four signals are output from the timing circuit 19-2 to the switch circuit 19-1. The left-hand side in FIG. 15 shows to which switch each signal is input.

That is, by switching the switch SW14 from "H" to "L", the charging of the external capacitance 17 is completed. After the charging is completed, the switch SW12 is switched from "H" to "L".

After that, the switch SW13 is switched from "L" to "H" for coupling to the down converter 12 and finally, the switch SW11 is switched from "L" to "H".

In this manner, it is possible to reduce the current consumption without causing a wasteful charge and discharge to occur.

Application Example

How the above-mentioned first to fifth embodiments are used will be explained.

Figure 16:
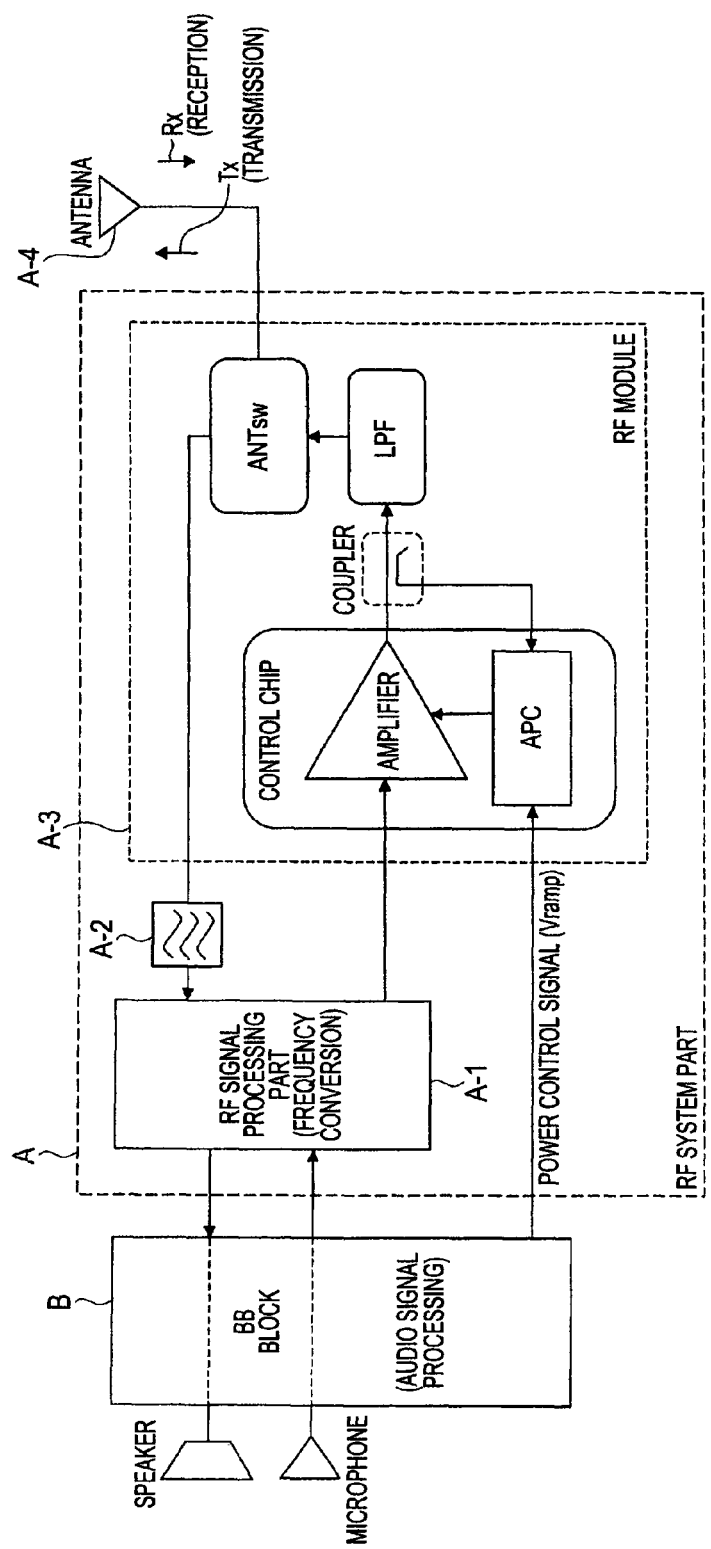
FIG. 16 is a block diagram showing an overall configuration of a mobile telephone including the negative bias generation circuit according to the present invention.
Figure 17:
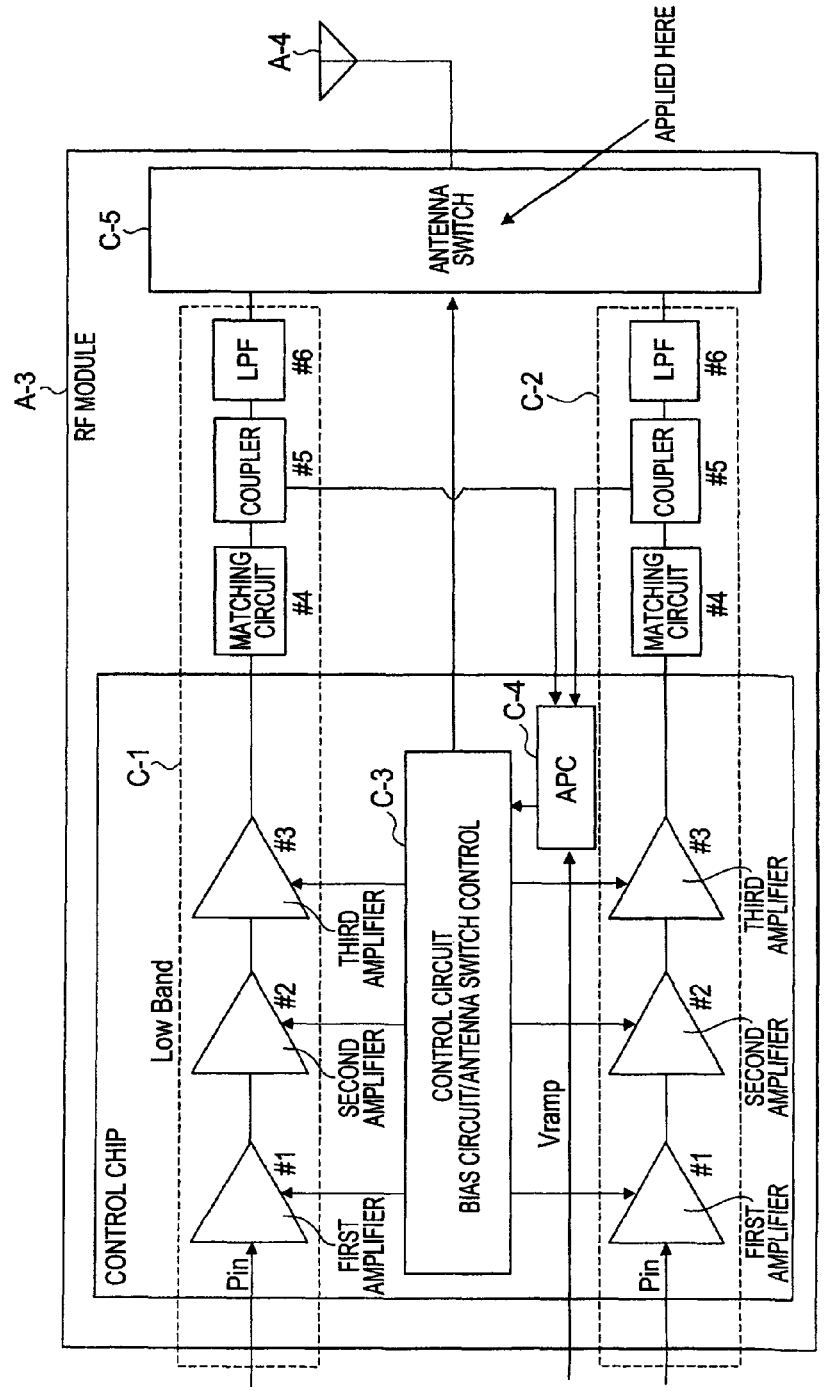
FIG. 17 is a block diagram showing a configuration of an RF module included in the mobile telephone in FIG. 16.

FIG. 16 is a block diagram showing an overall configuration of a mobile telephone including the negative bias generation circuit according to the present invention. FIG. 17 is a block diagram showing a configuration of an RF module A-3 included in the mobile telephone.

The mobile telephone includes an RF system part A and a BB block B.

The BB block B is a block that performs audio signal processing. Analog/digital conversion processing, such as sampling and quantization of an analog audio signal, is performed in the BB block B.

The RF system part A is a block that performs channel coding for a communication channel and channel coding for a transmission channel for carrying a digitally converted audio signal over a radio communication section.

The RF system part A includes an RF signal processing part A-1, a SAW filter A-2, and the RF module A-3. An antenna A-4 for receiving a signal in the radio section is also coupled thereto.

The RF signal processing part A-1 is a module that decodes a received signal sent from the SAW filter A-2 and encodes it into a form that can be handled in the BB block.

The SAW filter A-2 is one kind of band filter. The SAW filter A-2 removes unnecessary frequency components from the signal received by the antenna A-4.

The RF module A-3 is a transmission module that determines an output etc. in accordance with the transmission data sent from the RF signal processing part A-1 and the power control signal sent from the BB block B and outputs it actually from the antenna A-4.

The RF module A-3 also performs transmission/reception control to transmit the received signal that comes from the antenna A-4 to the SAW filter A-2 and the data in the transmission system that comes from a control chip (details will be explained in FIG. 17) within the RF module to the antenna A-4 using a switch, circulator, etc.

The first to fifth embodiments according to the present invention are applied to the RF module A-3.

Next, a configuration of the RF module A-3 in FIG. 17 is explained. In FIG. 17, only the module concerning transmission is described and the configuration of reception system is not described.

The RF module A-3 supports two frequency bands. The RF module A-3 includes a low frequency system circuit C-1 and a high frequency system circuit C-2. These circuits are different from each other only in the circuit configuration due to the difference in the handled frequency bands. The low frequency system circuit C-1 and the high frequency system circuit C-2 each include a first amplifier #1, a second amplifier #2, a third amplifier #3, a matching circuit #4, a coupler #5, and an LPF #6.

The first amplifier #1, the second amplifier #2, and the third amplifier #3 (generally referred to as HPA) are amplifiers for securing a predetermined gain in an output signal. By configuring the circuit into a multi-stage circuit, it is possible to increase the output power. Further, by setting the output impedance of the third amplifier #3 low, it is possible to easily match the impedance with a matching circuit 4.

The matching circuit 4 matches the impedance of HPA with that of the antenna.

The coupler #5 is an antenna coupler for performing feedback control by outputting the power of the output signal after being matched to an APC (C-4) to be described later.

The LPF #6 is a low pass filter to exclude harmonic components of the transmission signal.

Components other than those described include a control circuit C-3, the APC (C-4), and an antenna switch C-5.

The control circuit C-3 performs bias control of HPA and control of the antenna switch C-5.

The APC (C-4) is a control circuit shared by the low frequency system circuit C-1 and the high frequency system circuit C-2, and performs automatic power control to adjust the output signal after being matched by inputting a power control signal Vramp. A difference between the power of the output signal after being matched and the set value is output to the control circuit C-3 and the control circuit C-3 controls the first amplifier #1, the second amplifier #2, and the third amplifier #3 constituting HPA, respectively, based on the difference.

The antenna switch C-5 is a switch circuit that switches between the transmission side and the reception side, and switches between the low frequency system circuit C-1 and the high frequency system circuit C-2 on the same transmission side.

The first to fifth embodiments according to the present invention are applied to the antenna switch C-5.

As described above, the invention developed by the inventors of the present invention is explained specifically based on the embodiments, however, the present invention is not limited to the embodiments and it is needless to say that there can be various modifications within the scope not deviating from its gist.

The present invention is explained on the supposition of an antenna control circuit in accordance with SOI SW, a semiconductor device that realizes the antenna control circuit, and a mobile telephone that uses the semiconductor device. However, these are not limited and the present invention can be used in any applications that require switching excellent in responsiveness.

What is claimed is:

1. A semiconductor device having a negative bias generation circuit including:
    an oscillation circuit that can switch an output thereof between high frequency oscillation and low frequency oscillation;
    a down converter circuit that includes a first capacitor and stores charges in the first capacitor by an output of the oscillation circuit;
    a charge capacity switching circuit; and
    a second capacitor that is coupled in parallel to the first capacitor and can be disconnected electrically by the charge capacity switching circuit,
    wherein the oscillation circuit performs high frequency oscillation when the power of the semiconductor device is turned on,
    wherein the charge capacity switching circuit electrically disconnects the second capacitor from the first capacitor, and
    wherein the down converter circuit stores charges in the first capacitor.

2. The semiconductor device according to claim 1,
    wherein when the output of the oscillation circuit changes from high frequency oscillation to low frequency oscillation, the charge capacity switching circuit electrically couples the second capacitor to the first capacitor.

3. The semiconductor device according to claim 2,
    wherein the charge capacity switching circuit outputs a timing signal, and the output of the oscillation circuit changes from high frequency oscillation to low frequency oscillation upon receipt of the timing signal.

4. The semiconductor device according to claim 3, further including a power amplifier that supplies a power supply voltage,
    wherein the power supply voltage supplied by the power amplifier is changed in accordance with the timing signal.

5. The semiconductor device according to claim 2, further including a reset circuit,
    wherein the reset circuit outputs a reset signal, and the output of the oscillation circuit changes from high frequency oscillation to low frequency oscillation upon receipt of the reset signal.

6. The semiconductor device according to claim 5, further including a power amplifier that supplies a power supply voltage,
    wherein the power supply voltage supplied by the power amplifier is changed in accordance with the reset signal.

7. The semiconductor device according to claim 2,
    wherein while the second capacitor is disconnected from the first capacitor, the second capacitor stores charges from a power supply voltage.

8. The semiconductor device according to claim 1,
    wherein the oscillation circuit is configured to include an RC oscillator.

9. The semiconductor device according to claim 1,
    wherein the oscillation circuit is configured to include a ring oscillator.

10. A radio communication device including the semiconductor device according to claim 1,
    wherein the semiconductor device is used in an antenna switching circuit.

* * * * *